United States Patent
Stein et al.

[11] Patent Number: 5,227,034
[45] Date of Patent: Jul. 13, 1993

[54] METHOD FOR ELECTROLYTIC ETCHING OF SILICON CARBIDE

[75] Inventors: Rene Stein, Roettenbach; Georg Wittmann, Erlangen, both of Fed. Rep. of Germany

[73] Assignee: Siemens Aktiengesellschaft, Munich, Fed. Rep. of Germany

[21] Appl. No.: 780,015

[22] Filed: Oct. 21, 1991

[30] Foreign Application Priority Data

Oct. 19, 1990 [DE] Fed. Rep. of Germany ....... 4033355

[51] Int. Cl.$^5$ ................................................. C25F 3/02
[52] U.S. Cl. ............................ 204/129.1; 204/129.75; 204/129.6
[58] Field of Search ........... 204/129.1, 129.75, 129.65, 204/129.6

[56] References Cited

U.S. PATENT DOCUMENTS

| | | | |
|---|---|---|---|
| 3,042,593 | 7/1962 | Michlin | 204/129.75 X |
| 4,351,894 | 9/1982 | Yonezawa et al. | 204/129.65 X |
| 4,995,953 | 2/1991 | Yee | 204/129.75 X |

FOREIGN PATENT DOCUMENTS 0182998 10/1984 Japan ................................ 204/129.1

OTHER PUBLICATIONS

"The Etching of Silicon Carbide" vol. 4, pp. S199–S120 (1969).
"Atzpraxis fur Halbleiter" (Etching Practice for Semiconductors) pp. 138–142, Karl Hanser Verlag (1967).

Primary Examiner—Donald R. Valentine
Attorney, Agent, or Firm—Kenyon & Kenyon

[57] ABSTRACT

The invention provides an improved method for polish-etching of silicon carbide, which is arranged in series with an electrolyte and a metallic counter-electrode in a current circuit with an adjustable direct voltage, wherein an alkaline solution is used as the electrolyte, preferably in a high concentration and at great current density. In this way, uniform removal of the material and an even surface are obtained.

20 Claims, 1 Drawing Sheet

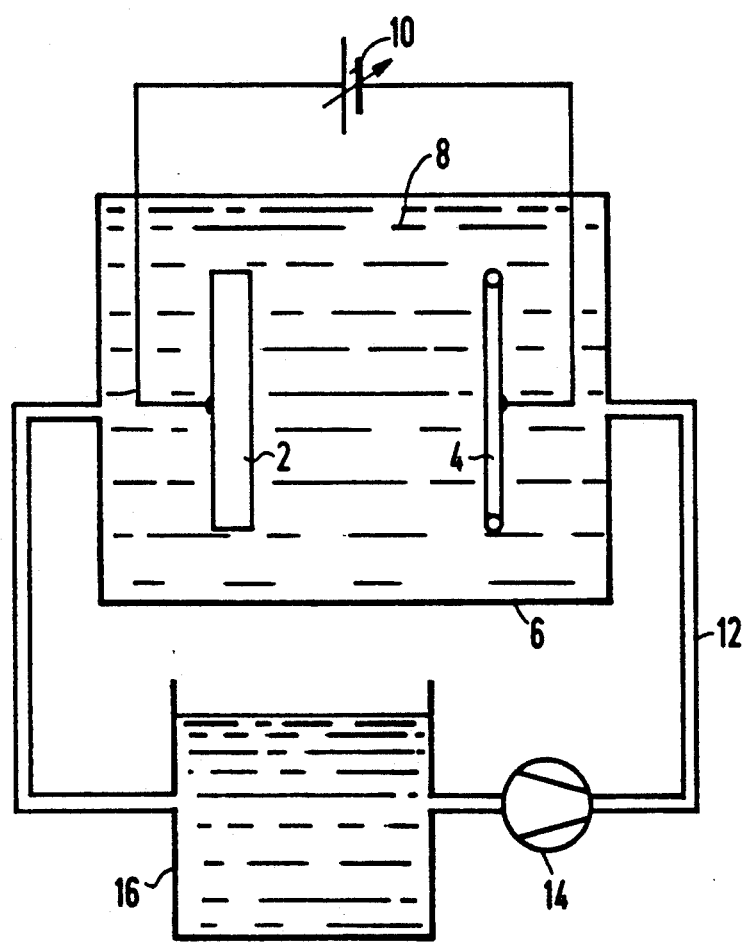

METHOD FOR ELECTROLYTIC ETCHING OF SILICON CARBIDE

BACKGROUND OF THE INVENTION

The invention relates to a method for electrolytic etching of silicon carbide SiC, which is arranged in series with an electrolyte and a metallic counter-electrode in a current circuit with an adjustable direct voltage.

SiC is suitable as a high-temperature and high-power component due to its physical properties. Due to the difficulties in the production of suitable monocrystals, very few crystal wafers are available, and therefore the methods required for subsequent processing are not developed to a great extent.

For subsequent processing, it is also important to have the smoothest possible substrate surface. Since a disturbed surface, a so-called damage layer, is usually left in the range of several micrometers after conventional mechanical polishing, methods for polish-etching were developed for semiconductors (for example, for silicon, germanium as well as gallium arsenide or indium phosphide) which remove the damage layer and result in an even surface. With this polish-etching, there is a reduction in thickness of the material, which is generally in wafer form, while maintaining the even surface formation, in that the peak atoms, which possess a lower bonding energy in the crystal lattice, are removed first. In most cases, chemical etchants or chemical-mechanical polishing methods are used. However, electrolytic etching methods are also known, which mostly work with acid electrolytes and, in rare cases, with alkaline ones. Polish-etching of the surface, for example of germanium, is carried out with a current density of up to 50 mA/cm$^2$, with caustic potash solution as the electrolyte, the concentration of which amounts to approximately 0.01% (Bogenschütz "Ätzpraxis für Halbleiter" ["Etching Practice for Semiconductors"], pages 138 to 142, Karl Hanser Verlag, Munich, 1967).

A known aqueous etching method for silicon carbide SiC at room temperature is electrolytic etching with hydrofluoric acid as the electrolyte. Etching takes place at a current density of up to approximately 0.5 A/cm$^2$ and a concentration of the electrolyte of up to approximately 2%. This results in textured etching, with which a stronger attack of the etchant on the surface takes place in the areas with lattice defects, for example; in these areas, depressions are therefore obtained (Mat. Res. Bull., Vol. 4 (1969), pages 199 to 210, Pergamon, Inc., USA).

SUMMARY OF THE INVENTION

It is an object of the invention to provide a method for polish-etching of a flat semiconductor element of silicon carbide SiC so as to obtain a damage-free, even surface which is suitable for further processing to yield electronic components, and, in particular, on which further epitaxial layers can grow. It is known that silicon carbide SiC is not attacked by acids and bases. Therefore, these conventional etchants cannot be used.

The invention is based on the recognition that polish-etching of silicon carbide is not possible with these known methods. In accordance with the invention a method for electrolytic etching of silicon carbide is provided wherein the electrolyte is an alkaline solution. Completely smooth and even surfaces, without any texture, are obtained when an alkaline solution that contains fewer protons than negative hydroxide ions, and the pH of which is greater than 7, is used as the electrolyte. Even at high resolution in the raster electron microscope, no unevenness can be detected. Additional particularly advantageous characteristics of the method are evident from the dependent claims.

BRIEF DESCRIPTION OF THE DRAWING

For a further explanation of the invention, reference can be made to FIG. 1 in which an embodiment of an arrangement for implementation of the method according to the invention is illustrated schematically.

DETAILED DESCRIPTION OF THE INVENTION

Referring to FIG. 1 a wafer-form semiconductor element 2 of silicon carbide SiC is arranged, together with a counter-electrode 4, in a container 6, which contains an electrolyte 8. The silicon carbide wafer 2 and the counter-electrode 4 are arranged in a current circuit with an adjustable direct voltage. This voltage source is designated as 10 in the figure and can be a so-called constant current source, for example.

The counter-electrode 4 consists at least partly of electrically conductive material, preferably a precious metal, in particular platinum or gold. In the embodiment shown, this electrode consists of a coil of a platinum wire. The electrolyte 8 consists of an alkaline solution, preferably with a high concentration of at least 1 normal, particularly 3 normal. The voltage source 10 is adjusted so that a high current density of at least 0.1 A/cm$^2$, preferably at least 0.1 A/cm$^2$, but generally not significantly exceeding 10 A/cm$^2$, and particularly amounting to approximately 1 to 6 A/cm$^2$, is obtained in the electrolyte 8, between the electrodes 2 and 4. In combination with caustic potash solution KOH or caustic soda solution NaOH as the electrolyte, a concentration of preferably at least 5 normal, particularly at least 10 normal, is used, and a current density approximately 2 to 3 A/cm$^2$ is adjusted.

The concentration of the electrolyte is preferably kept constant, at least in the vicinity of the surface of the silicon carbide 2 to be polished. For this purpose, a circulation of the electrolyte is provided, with a pipe line 12, which contains a pump 14 and a container 16. The size of this container 16 is selected so that the electrolyte remains in it for an extended period during circulation, so that gas bubbles which have formed on the electrodes 2 or 4 can get to the surface, not specifically indicated, of the electrolyte in the container 16. In this way, gas bubbles are removed from the electrolyte 8 with this circulation.

What is claimed is:

1. In a method for electrolytic etching of silicon carbide SiC, which is arranged in series with an electrolyte and a metallic counter-electrode in a current circuit with an adjustable direct voltage, the improvement comprising providing an alkaline solution as the electrolyte.

2. The method according to claim 1 wherein the alkaline solution has a concentration of electrolyte of at least 1 normal.

3. The method according to claim 2 wherein a current density of about 0.5 to 10 A/cm$^2$ is provided in the alkaline solution.

4. The method according to claim 3 wherein caustic potash solution KOH is provided as the alkaline solution.

5. The method according to claim 3 wherein caustic soda solution NaOH is provided as the alkaline solution.

6. The method according to claim 2 wherein caustic potash solution KOH is provided as the alkaline solution.

7. The method according to claim 2 wherein caustic soda solution NaOH is provided as the alkaline solution.

8. The method according to claim 1 wherein a current density of about 0.5 to 10 A/cm$^2$ is provided in the alkaline solution.

9. The method according to claim 8 wherein the current density is approximately 1 to 6 A/cm$^2$.

10. The method according to claim 9 wherein caustic potash solution KOH is provided as the alkaline solution.

11. The method according to claim 8 wherein caustic soda solution NaOH is provided as the alkaline solution.

12. The method according to claim 8 wherein caustic potash solution KOH is provided as the alkaline solution.

13. The method according to claim 8 wherein caustic soda solution NaOH is provided as the alkaline solution.

14. The method according to claim 1 wherein caustic potash solution KOH is provided as the alkaline solution.

15. The method according to claim 14 wherein a current density of .2 to 3 A/cm$^2$ is provided in the alkaline solution.

16. The method according to claim 14 wherein the alkaline solution has a concentration of electrolyte of at least 3 normal.

17. The method according to claim 1 wherein caustic soda solution NaOH is provided as the alkaline solution.

18. The method according to claim 17 wherein a current density of 2 to 3 A/cm$^2$ is provided in the alkaline solution.

19. The method according to claim 1 wherein the alkaline solution has a concentration of electrolyte which is kept constant in the vicinity of a surface of the silicon carbide.

20. The method according to claim 17 wherein the alkaline solution has a concentration of electrolyte of at least 3 normal.

* * * * *